United States Patent
Stinnett (12) 
(10) Patent No.: US 6,325,861 B1
(45) Date of Patent: *Dec. 4, 2001

(54) METHOD FOR ETCHING AND CLEANING A SUBSTRATE

(75) Inventor: James A. Stinnett, Mountain View, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/156,959

(22) Filed: Sep. 18, 1998

(51) Int. Cl.[7] .................................................. B08B 5/00
(52) U.S. Cl. .............................. 134/2; 134/21; 134/26; 134/30
(58) Field of Search .................................. 134/2, 26, 30, 134/21; 156/638, 643

(56) References Cited

U.S. PATENT DOCUMENTS

| | | | |
|---|---|---|---|
| 4,693,779 | * 9/1987 | Okuhira et al. | 156/638 |
| 5,174,856 | 12/1992 | Hwang et al. | 156/643 |
| 5,174,865 | * 12/1992 | Hwang et al. | 156/643 |
| 5,198,634 | 3/1993 | Mattson et al. | 219/121.43 |
| 5,262,279 | 11/1993 | Tsang et al. | 430/311 |
| 5,578,163 | 11/1996 | Yachi | 156/643.1 |
| 5,674,357 | 10/1997 | Sun et al. | 156/659.11 |
| 5,824,604 | * 10/1998 | Bar-Gadda | 438/725 |
| 5,830,397 | * 1/1995 | Fukuyama et al. | 156/643 |
| 5,849,639 | 12/1998 | Molloy et al. | 438/714 |

FOREIGN PATENT DOCUMENTS

58087276 * 5/1983 (JP).

* cited by examiner

Primary Examiner—Zeinab El-Arini
(74) Attorney, Agent, or Firm—Janah and Associates (57) ABSTRACT

A method of cleaning a substrate 5 to remove etchant residue 10 formed during etching of the substrate, the method comprising the step of exposing the substrate in a process zone 135, to an activated cleaning gas comprising halogen-substituted saturated hydrocarbon gas, oxygen gas, and nitrogen gas.

43 Claims, 3 Drawing Sheets

METHOD FOR ETCHING AND CLEANING A SUBSTRATE

BACKGROUND

The present invention relates to a method for etching and cleaning a semiconductor substrate.

In the manufacture of integrated circuits, active devices are formed on a semiconductor substrate by alternately depositing and etching layers of dielectric, semiconducting, and conducting materials, such as silicon dioxide, polysilicon, and metal compounds and alloys. These layers are etched to form a pattern of etched features, by providing a resist layer of photoresist and/or oxide hard mask on the substrate, and using lithography to expose and pattern the resist layer. The portions of the layers adjacent to the patterned resist features are etched to form a predefined pattern of gates, vias, contact holes, trenches, and/or metal interconnect lines. Etching is typically performed using a capacitively or inductively coupled plasma of halogen-containing gases, as for example described in *Silicon Processing for the VLSI Era*, Vol. 1, Chapter 16, by Wolf and Tauber, Lattice Press, 1986, which is incorporated herein by reference.

After the etching process, etchant residue and remnant resist material that remain on the substrate are removed prior to processing of the next layer on the substrate. The etchant residues formed during the etching processes are typically complex compositions that condense from the vaporized plasma environment onto the freshly etched features and other surfaces of the substrate. The composition of the etchant residue depends upon the composition of the etching gas, the vaporized species of the layer that is being etched, and the composition of the organic resist or hard mask layer that is sputtered or etched away by energetic plasma ions. Typically, the etchant residue comprises a polymeric composition containing carbon, hydrogen, oxygen, and nitrogen species. When dielectric layers were etched to form vias, the etchant residue also includes vaporized metal species, such as aluminum, titanium, copper, or mixtures thereof. Vias are plugs of conducting material that electrically connect to a metal interconnect line underlying the dielectric layer. Vias are formed by etching a hole or void into the dielectric layer, and subsequently filling the hole with a conducting material. To provide better electrical contact, the etching generally comprises an overetch step that removes a surface thickness of from 50 to 300 Å of the underlying metal layer.

One method of cleaning or removing the residue material is a dry cleaning method in which a plasma of a gas, such as oxygen is used to burn off the residue material remaining on the substrate. However, etchant residue is difficult to remove by dry cleaning methods because the chemical composition the etchant residue varies widely across the substrate surface, and a plasma that is sufficiently aggressive to remove all of the etchant residue across the entire substrate surface will often damage the underlying substrate. This is especially true when the etchant residue contains metal species, such as the etchant residue obtained after a via etching process in which a thin surface layer of the exposed metal is etched away and the etched metal species condense as the etchant residue. For these reasons, the etchant residue is typically removed by a wet cleaning process in which the substrate is scrubbed in a heated solvent (for example EKC 265, commercially available from Shipley, Co., Newton, Massachusetts) to dissolve accumulated etchant residue. However, the wet cleaning process often requires a solvent that is costly and hazardous to the environment. Moreover, transferring the substrate from the etching process chamber to a wet cleaning station lowers yields from the substrate due to contamination in the transferring operation. Furthermore, exposure of the freshly etched metal features to the atmosphere during transport of the substrate between the different processing stations can oxidize contact/junction points, providing high electrical contact resistances, which are undesirable.

Yet another problem with conventional processes for cleaning and removing etchant residue and stripping or ashing remnant resist on the substrate, arises from the high process temperatures that are used during the stripping process. Conventional resist stripping processes heat the substrate to temperatures of 200 to 400° C. in an oxygen plasma to ash and burn off the remnant resist. The high substrate temperatures can damage the active devices formed on the substrate, for example, by causing diffusion of dopant material to and from the active semiconductor regions. Also, high temperatures can thermally degrade low dielectric constant (low K) dielectric materials which are typically organic polymer materials.

Accordingly, there is a need for a process for removing etchant residue and stripping remnant resist across the entire surface of a substrate, without damaging or etching the surrounding or underlying layers. It is also desirable for the process to minimize exposure of the substrate to oxidizing environments when performing multiple etching and cleaning process steps. It is further desirable to have an etching and cleaning process that does not result in high electrical contact resistance at junction points on the substrate surface and that operates at low temperatures to prevent diffusion between, or thermal degradation of, the substrate layers.

SUMMARY

The present invention provides a method of etching a substrate, and for treating the etched substrate to remove etchant residue formed during etching of the substrate. The method is particularly useful for etching a substrate having a metal layer covered by a dielectric layer, and etch-resistant features overlying the dielectric layer. In the etching process, the substrate is exposed to an activated halogen-containing etchant gas for etching the dielectric layer on the substrate, thereby forming etchant residue containing metal species on the substrate.

Thereafter, the etchant residue on the etched substrate is removed by exposing the substrate in a process zone to an activated cleaning gas comprising halogen-substituted saturated hydrocarbon gas, oxygen gas, and nitrogen gas. Preferably, the halogen-substituted saturated hydrocarbon gas comprises a ratio of saturated hydrocarbon groups to halogen species of from about 1:2 to about 4:1. The volumetric flow ratio of halogen-substituted saturated hydrocarbon gas to oxygen gas is sufficiently high to remove substantially all the etchant residue on the substrate. In a preferred embodiment, the cleaning gas comprises $CH_3F$, $O_2$, and $N_2$, the volumetric ratio of $CH_3F$ to $O_2$ being from about 1:5 to 2:1.

Optionally, remnant resist material that remains on the substrate after the etching process is stripped by exposing the substrate to an activated stripping gas comprising oxygen gas and carbon tetrafluoride.

DRAWINGS

These and other features, aspects, and advantages of the present invention will be better understood from the following drawings, description, and appended claims, which illustrate examples of the invention, where:

DESCRIPTION

The process of the present invention is useful for etching a semiconductor substrate 5 and cleaning and removing etchant residue 10 and remnant resist 15 from the substrate. Although the cleaning method of the present invention is illustrated for removing etchant residue 10 and remnant resist 15 from semiconductor substrates 5, the method can also be used for other substrates, such as printed circuit boards, flat panel displays, and liquid crystal displays.

Figure 1A:
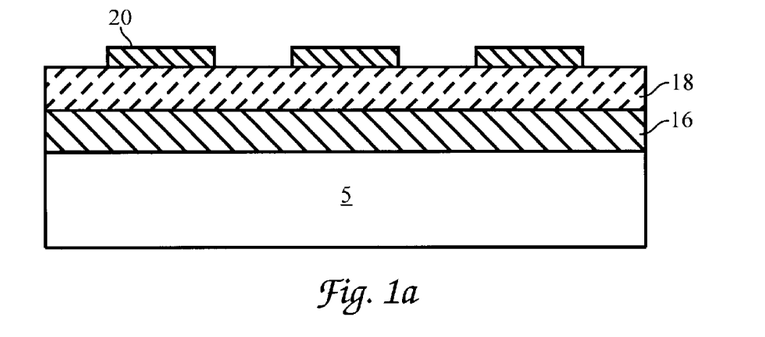
FIG. 1a is a schematic in vertical cross-sectional view of a dielectric layer covering electrically conductive interconnection lines on a substrate, and a patterned resist layer formed on the dielectric layer.
Figure 1B:
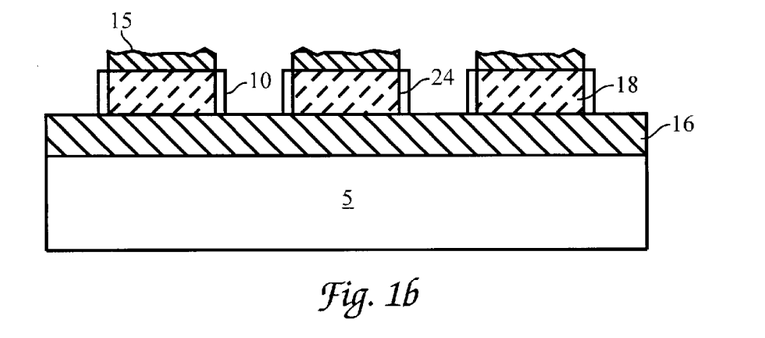
FIG. 1b is a schematic in vertical cross-section of the substrate of FIG. 1a after etching of the dielectric layer showing etchant residue and remnant resist.
Figure 1C:
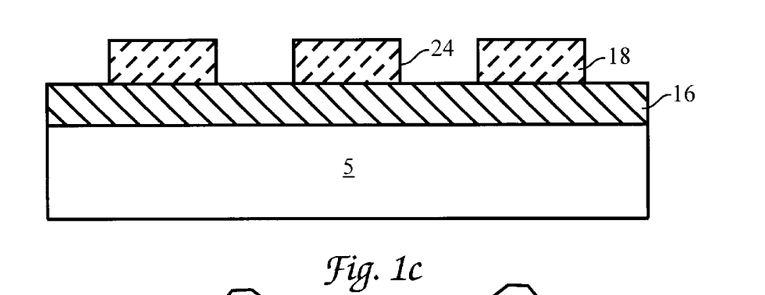
FIG. 1c is a schematic in vertical cross-sectional view of the substrate of FIG. 1b, after the etchant residue has been removed and remnant resist stripped by the process of the present invention.

FIG. 1a shows a typical substrate 5 comprising a metal layer 16 covered by a dielectric layer 18, and patterned etch-resistant features 20 overlying the dielectric layer. In an etching process, the etchant gas etches the exposed portions of the dielectric layer 18 to form holes or vias 22 that extend through the dielectric layer 18 to the contact junction points in the underlying metal layer 16, as schematically illustrated in FIGS. 1b and 1c. During the etching process, etchant residues 10 comprising complex compositions of the vaporized or gaseous species in the activated etchant gas are deposited on the surface and sidewalls 24 of etched features on the substrate 5. After the etching process, the etchant residue 10 along with any remnant resist material remaining on the substrate 5 must be removed to provide a clean substrate surface for subsequent processing steps.

Figure 2:
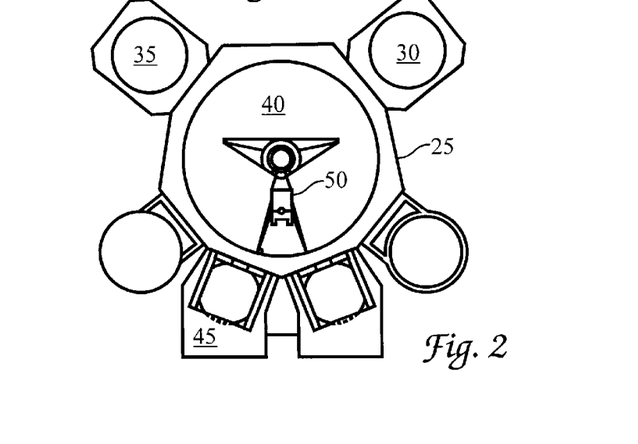
FIG. 2 is a schematic top view of a multi-chamber processing platform.

Referring to FIG. 2, in accordance with the present invention, the substrate 5 is etched and cleaned, in a multi-chamber platform 25 comprising an etching chamber 30 for etching the substrate 5, and a cleaning chamber 35 for removing etchant residue 10 and remnant resist 15 that remains on the substrate after the etching process. The etching chamber 30, cleaning chamber 35, a transfer chamber 40, and a load lock chamber 45 are all interconnected in a vacuum sealed environment that is maintained at a low pressure to reduce contamination of the substrate 5.

Figure 3:
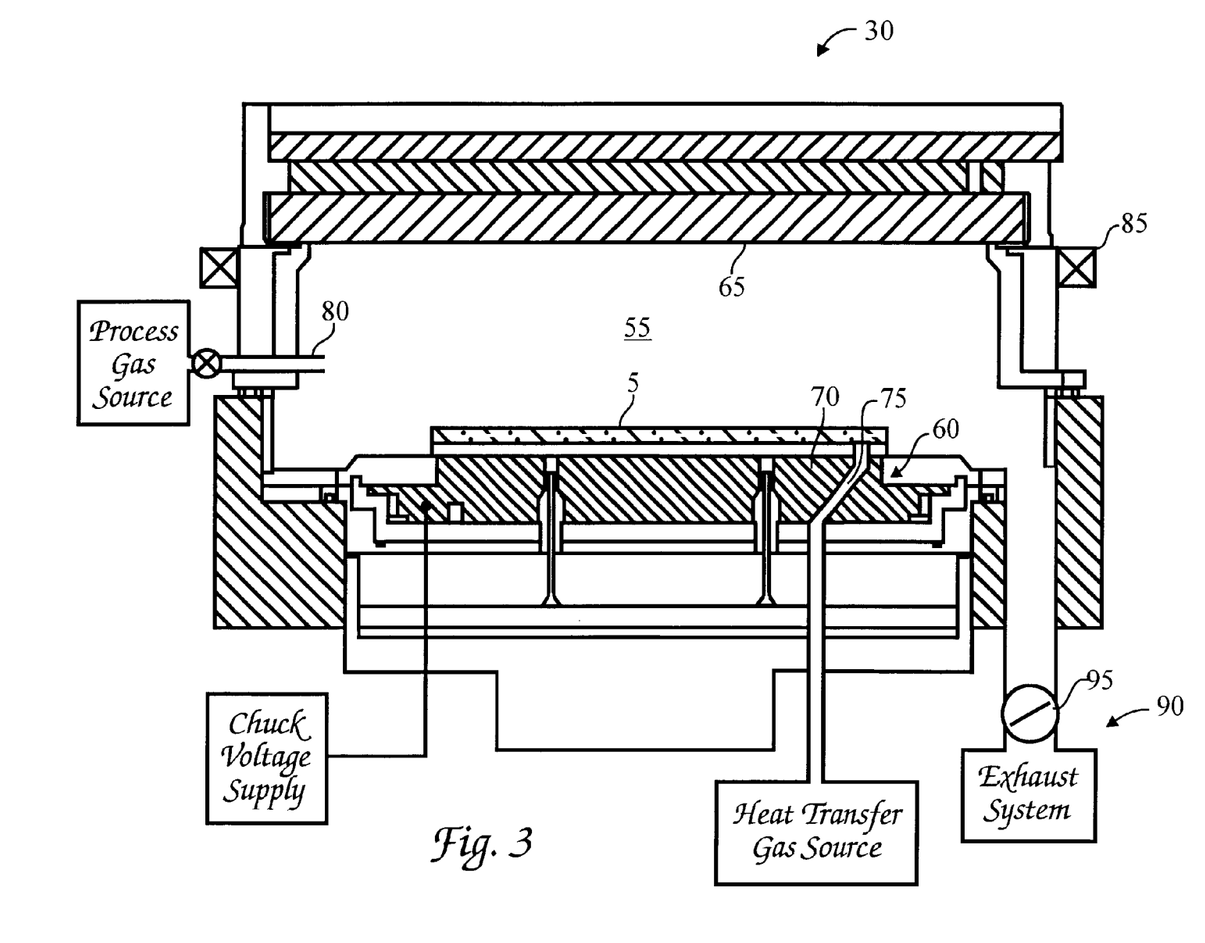
FIG. 3 is a schematic view in vertical cross-section of an etching chamber suitable for performing an etching process of the present invention.

FIG. 3 illustrates an exemplary etching chamber 30 that is suitable for etching a dielectric layer on the substrate 5. To perform a process according to the present invention, a substrate 5 is transferred from the load lock 45, to the transfer chamber 40, and then to the etching chamber 30 by a robotic arm 50. The substrate 5 is placed on a support 60 in a process zone 55 of the etching chamber 30. The substrate 5 can be held in place during the etching process using a mechanical or electrostatic chuck 70 with grooves 75 in which a coolant gas, such as helium is held to control the temperature of the substrate 5. The process zone generally comprises a volume of at least about 5,000 $cm^3$, and more typically from about 10,000 to about 50,000 $cm^3$. An activated etchant gas is provided in the process zone 55 to etch one or more layers on the substrate 5 by coupling microwave energy or RF energy to an etchant gas.

Etchant gas is introduced into the etching chamber 30 through a gas distributor 80 disposed peripherally about the substrate 5, and the etching chamber 30 is maintained at a pressure of from about 1 to about 1000 mTorr, and more typically from 1 to 400 mTorr. An electric field can be maintained in the process zone 55 to form an activated etchant gas by (i) inductively applying a RF current to an inductor coil (not shown) encircling the etching chamber 30, (ii) capacitively applying a RF voltage to the cathode and anode electrodes in the etching chamber 30, or (iii) both inductively and capacitively. In the embodiment shown in FIG. 3, the activated etchant gas is formed by a capacitive electric field maintained in the etching chamber 30 by the support 60 which also serves as a cathode electrode, and a ceiling 65 of the etching chamber 30 which is electrically grounded to form an anode electrode. The etchant gas is activated by electrically grounding the anode electrode 65 and applying a RF voltage at a power level of from about 100 to about 2000 Watts to the cathode electrode 60. The frequency of the RF voltage applied to the process electrodes 60, 65 is typically from about 50 Khz to about 60 MHZ, and more typically about 13.56 MHZ.

The activated etchant gas or plasma can also be enhanced using electron cyclotron resonance or magnetically enhanced reactors, in which a magnetic field generator 85, such as a permanent magnet or electromagnetic coils is used to apply a magnetic field in the process zone 55 to increase the density and uniformity of the plasma in the process zone 55. Preferably, the magnetic field comprises a rotating magnetic field with the axis of the field rotating parallel to the plane of the substrate 5, as described in U.S. Pat. No. 4,842,683, issued Jun. 27, 1989, which is incorporated herein by reference. The magnetic field in the etching chamber 30 should be sufficiently strong to increase the density of the ions formed in the plasma, and sufficiently uniform to reduce charge-up damage to features such as CMOS gates. Generally, the magnetic field as measured on a surface of the substrate 5 is less than about 500 Gauss, and more typically from about 10 to about 100 Gauss.

Spent etchant gas and etchant byproducts are exhausted from the etching chamber 30 through an exhaust system 90 comprising one or more roughing pumps and turbomolecular pumps and which is capable of achieving a minimum pressure of about $10^{-3}$ mTorr in the etching chamber 30. Typically, a throttle valve 95 is provided in the exhaust for controlling the pressure in the etching chamber 30.

After completion of etching, the substrate 5 is dechucked using suitable dechucking means. For example, a pneumatic lifting apparatus which raises lift pins (not shown) in the support 60 to raise the substrate 5 from the surface of the support. The robotic transport arm 45 is inserted between the substrate and the chuck 70 to lift the substrate off the lift pins. Thereafter, the lift pins are retracted into the chuck 70, and the robotic arm 50 transports the substrate 5 out of the etching chamber 30 and into the transfer chamber 40.

The etchant gas composition is selected to provide high etch rates, and highly selective etching of the particular dielectric layer 18 that is being etched. A typical dielectric layer 18 is composed of silicon oxide, silicon nitride, or a polymeric dielectric material such as polyimide or BCB (benzocyclobutene). A suitable etchant gas composition for etching a $SiO_2$ dielectric layer, for example, comprises fluorocarbon gas for etching the dielectric layer and forming passivating deposits on the substrate 5, oxygen gas for enhancing formation of passivating deposits, and nitrogen-containing gas for etching the passivating deposits on the substrate 5. In addition, an inert gas can be added to the etchant gas to provide sputtering ions that sputter and remove material from the substrate 5. Preferably, the etchant gas comprises $CF_4$, $O_2$, and $N_2$, in a volumetric ratio that efficiently etches vias 22 or holes through exposed portions of the dielectric layer 18 to contact junction points in an underlying metal layer 16.

During the etching process, etchant residues 10 of complex compositions of the vaporized or gaseous species in the activated etchant gas are deposited on the surface and sidewalls 24 of etched features on the substrate 5. The composition of the etchant residue 10 depends upon the composition of the etchant gas, the composition of vaporized species of the layer that is being etched, and the composition of the overlying resist and/or hard mask layer of the etch resistant features 20 that is being sputtered or etched away by the activated gas. Typically, the etchant residues 10 comprise a polymeric or amorphous composition of hydrocarbon species such as carbon or hydrogen species, as well as other species such as oxygen or nitrogen species. In the etching of silicon dioxide layers, the etchant residue 10 also contains vaporized silicon-containing species that originate from the silicon dioxide dielectric layer. When the underlying metal layer 16 is partially etched, the etchant residue 10 also includes vaporized metal species, such as aluminum, titanium, copper, or mixtures thereof. The etchant residue 10 forms on sidewalls 24 of etched vias 22 and serves as an inhibitor or passivator layer that prevents excessive etching through the sidewalls 24 of the freshly etched features and enhances anisotropic etching by stopping etching in the direction parallel to the plane of the substrate 5. However, after the etching process, the etchant residue 10 along with any remnant resist material remaining on the substrate 5 must be removed to provide a clean substrate surface for subsequent processing steps.

Figure 4:
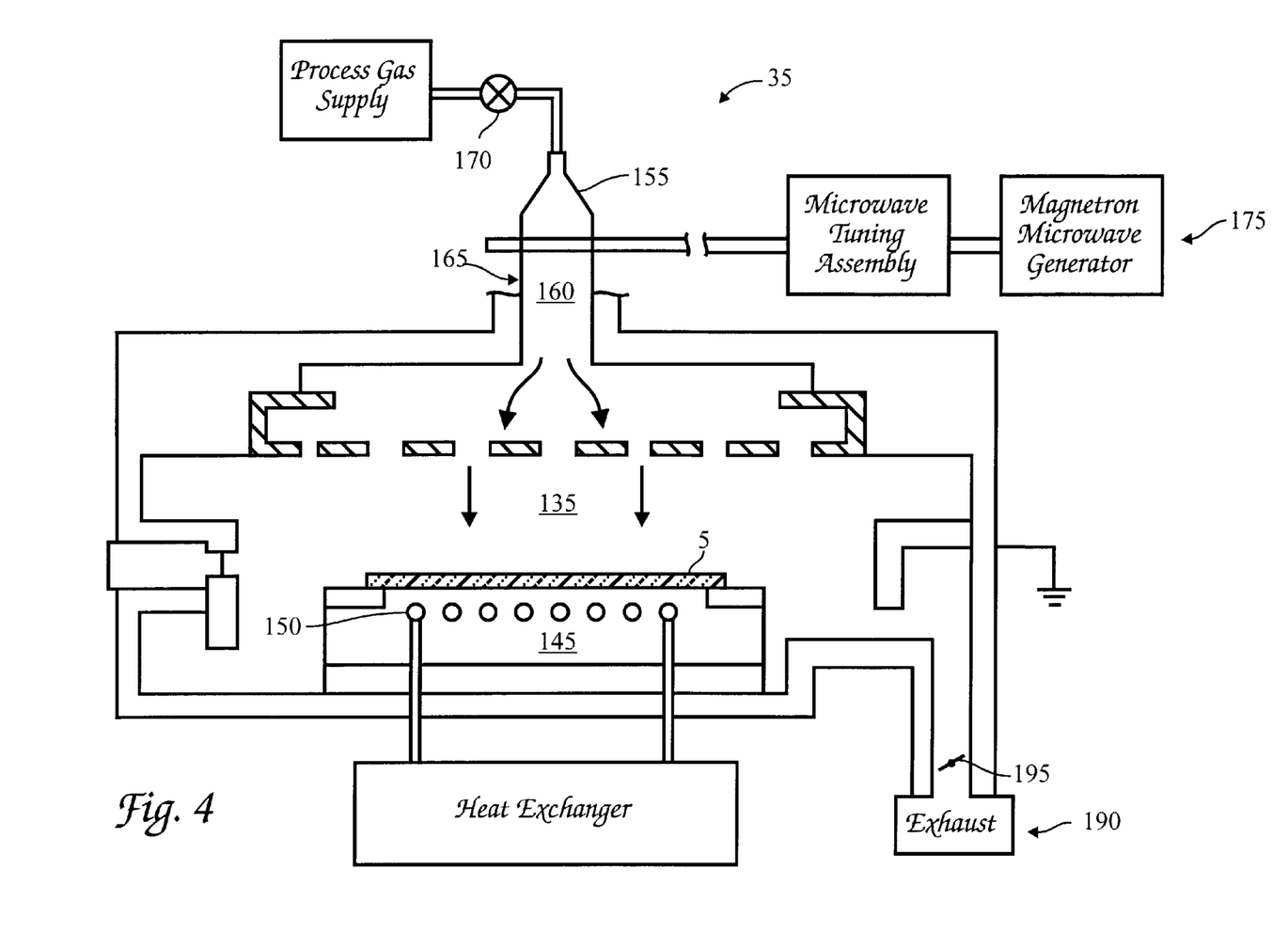
FIG. 4 is a schematic view in vertical cross-section of a cleaning chamber suitable for performing a cleaning process of the present invention.

To remove the etchant residue 10 and remnant resist 15, the substrate 5 is transferred from the etching chamber 30 to a process zone 135 of the cleaning chamber 35, illustrated in FIG. 4. The chamber shown herein is provided only to illustrate the process of the present invention, and should not be used to limit the scope of the invention, because other cleaning chambers can also be used to remove etchant residue or strip remnant resist 15 from the substrate 5. The substrate 5 is placed on a support 145, and held in place during processing by an electrostatic chuck (not shown). Heat transfer fluid from a heat exchanger is circulated through coolant passages 150 in the support to control the temperature of the substrate 5.

In the cleaning chamber 35 illustrated in FIG. 4, a cleaning gas is introduced through a gas distributor 155 into a remote plasma generation zone 160 in a remote chamber 165. By "remote" it is meant that the center of the remote chamber 165 is at a fixed upstream distance from the center of the process zone 135. In the remote chamber 165, the cleaning gas is activated by coupling microwave or RF energy into the remote chamber 165, to energize the cleaning gas and cause ionization or dissociation of the cleaning gas components, prior to its introduction into a process zone 140 in the cleaning chamber 35. Preferably, the remote plasma zone 160 is sufficiently distant from the process zone 140 to allow recombination of some of the dissociated or ionized gaseous chemical species. The resultant reduced concentration of free electrons and charged species in the activated cleaning gas minimizes charge-up damage to the active devices on the substrate 5, and provides better control of the chemical reactivity of the activated gas formed in the remote plasma zone 160. The ratio of the chemically dissociated to non-dissociated or recombined chemical species affects the etching characteristics, with the highly dissociated species providing a more chemically reactive etching process than non-dissociated species. Preferably, the center of the remote plasma zone 160 is at a distance of at least about 50 cms from the center of the process zone 135.

In the embodiment illustrated in FIG. 4, the remote chamber 165 comprises a tube shaped cavity connected to the process zone 135 of the cleaning chamber 35. Flow of cleaning gas into the remote chamber 165 is adjusted by a mass flow controller or gas valve 170. Preferably, the remote chamber 165 comprises walls made of a dielectric material such as quartz, aluminum oxide, or monocrystalline sapphire that is transparent to microwaves and is non-reactive to the cleaning gas. A microwave generator 175 is used to couple microwave radiation to the remote plasma zone 160 of the remote chamber 165. Typically, the microwave generator 175 comprises a magnetron, a microwave tuning assembly, and an applicator—a short segment of waveguide abutting the remote chamber. The microwave generator can comprise any conventional microwave generator, such as for example, microwave generators commercially available from Daihen Corporation, Japan. The microwave generator is typically operated at a power level of about 200 to about 3000 Watts, and at a frequency of about 800 MHZ to about 3000 MHZ. Spent cleaning gas and byproducts is exhausted from the cleaning chamber through an exhaust system 190 capable of achieving a minimum pressure of about 50 mTorr in the cleaning chamber. A throttle valve 195 in the exhaust 190 is used for maintaining a chamber pressure from about 300 to about 3000 mTorr.

The process of the present invention sequentially removes the etchant residue 10 and remnant resist 15 on a semiconductor substrate 5 in multiple steps, without using an intermediate wet cleaning process step. In the cleaning step, an activated or energized gas is formed from a cleaning gas that is capable of removing the carbon and hydrogen components as well as other metal components that are intermixed in the etchant residue 10 on the substrate 5 making it particularly difficult to remove because of its variant composition. Etchant residue 10 is also difficult to remove because it typically forms an amorphous-type hard glassy material that is difficult to chemically remove or clean from the substrate 5 without damaging other features formed on the substrate.

The cleaning gas comprises a halogen-substituted saturated hydrocarbon gas that reacts with etchant residue 10 to form volatile gaseous species that are exhausted from the chamber. By saturated hydrocarbon gas it is meant a hydrocarbon gas in which all available valence bonds of the carbon atom of the hydrocarbon gas are attached to other atoms, i.e., the saturated hydrocarbon gas is substantially absent double or triple carbon—carbon bonds. By halogen-substituted gas it is meant that in the hydrocarbon gas, at least one hydrogen atom is replaced by a halogen atom by means of a chemical reaction. It is believed that the halogen-substituted saturated hydrocarbon gas reacts with metal species present in the etchant residue 10 as elements or compounds, to form volatile gaseous compounds that can be removed by the exhaust system 180.

Preferably, the halogen-substituted saturated hydrocarbon gas serves as a source of hydrocarbon radicals and halogen radicals to the process environment. The methyl radicals upon being activated or energized, combine with metallic species in the etchant residue to form metal-substituted hydrocarbons that are volatile and gaseous and can be easily exhausted from the chamber. For example, activated or energized $CH_3F$ gas combine with aluminum or titanium in the etchant residue, in the following reactions:

$$6CH_3F+2Al \rightarrow 2(CH_3)_3Al+3F_2 \qquad (1)$$

$$2CH_3F+2Ti \rightarrow 2CH_3Ti+F_2 \qquad (2)$$

Some of these volatile species, such as $(CH_3)_3Al$, have relatively low condensation temperatures and can condense or otherwise redeposit material on the substrate 5, and should be rapidly exhausted from the chamber 35 to prevent their re-condensation onto the substrate. The energized halogen-substituted species of the saturated hydrocarbon gas, such as fluorine species, react with the silicon-containing components of the etchant residue 10 to form volatile gaseous species, such as $SiF_4$, which are also exhausted from the chamber 35.

The halogen-substituted saturated hydrocarbon gas also preferably comprises a relatively high ratio of saturated hydrocarbon groups to substituted halogen species because the desired selectivity to silicon dioxide requires a low fluorine environment. Preferably, the ratio of saturated hydrocarbon groups to substituted halogen species is at least 1:2, and more preferably from about 1:1 to 4:1. Suitable halogen-substituted saturated hydrocarbon gases that have a high ratio of saturated hydrocarbon groups to halogen species, comprises gases such as for example, $CH_3F$, $CH_3Cl$ or $CH_3Br$, all of which have a ratio of hydrocarbon groups to halogen species of about 1:1.

A preferred halogen-substituted saturated hydrocarbon gas for removing etchant residue from etching a $SiO_2$ dielectric layer 18 over an aluminum layer 16 comprises $CH_3F$ gas, because the fluorine species in the gas is highly reactive to silicon-containing etchant residue. Also, the fluorine species does not chemically attack or otherwise degrade the exposed portions of the underlying metal layer, especially when the underlying layer 120 contains aluminum. This is especially surprising because the $CH_3F$ gas is typically used for depositing etchant residue in the form of sidewall deposits (commonly known as sidewall polymer) on the etched features. For example, $CH_3F$ is commonly used during metal etching processes to serves as a source of free carbon species to enhance the deposition of an inhibitor or passivator layer. Thus, it was unexpected to discover that the $CH_3F$ gas can also be used to remove or etch away the etchant residue, especially when the etchant residue is composed of elemental metal or metal compounds in an amorphous or polymer matrix.

In addition, the cleaning gas comprises oxygen gas that reacts with the hydrocarbon, carbon, or hydrogen components of the etchant residue to form gaseous carbon, hydrogen, or hydrogen compounds that are exhausted from the chamber. The oxygen gas removes the hydrocarbon groups in a low temperature energized or activated plasma gas in which the oxygen dissociates the hydrocarbon species in the etchant residue to form gaseous carbon-oxygen species such as CO, $CO_2$, and other carbon-containing gases. Typically, the operating temperatures are in the range of from about 40 to about 100° C.

The volumetric flow ratio of halogen-substituted saturated hydrocarbon gas to oxygen gas is selected to remove all of the metal-containing and silicon-containing components in the etchant residue. The ratio of the metal species, silicon components, and hydrocarbon can vary in the amorphous etchant residue depending on the type of material that was previously etched and the composition of the resist material and/or etchant gas. The substrate 5 is exposed to an activated cleaning gas comprising a volumetric flow ratio of halogen-substituted saturated hydrocarbon gas to oxygen gas to nitrogen gas that is sufficiently high to remove substantially all the etchant residue on the substrate without requiring a post etch wet solvent cleaning step. When halogenated hydrocarbons are used to etch vias in a dielectric layer, such as for example, a layer of silicon oxide, silicon nitride, or polyimide (low K dielectric layer) on the substrate 5, a suitable volumetric flow ratio of halogen-substituted saturated hydrocarbon gas to oxygen gas (the ratio of $CH_3F$ to $O_2$) that removes substantially all the etchant residue from the substrate is from about 0.25 to about 2, and more preferably from about 0.75 to about 1.5.

Preferably, the cleaning gas further comprises a non-reactive gas, such as $N_2$ or Ar, to further reduce or limit etching of the exposed portions of the dielectric layer, and to improve the etching selectivity of the cleaning process to the dielectric layer. The nitrogen gas also serves to transport saturated hydrocarbon radicals past the substrate 5 surface to maximize the percentage of reactive or active gas species that react with the substrate. The volumetric flow ratio of inert gas to the other cleaning gas components is selected to enhance etching selectivity without detrimentally affecting the rate of removal of the etchant residue, by excessive dilution of the cleaning gas composition. Preferably, the volumetric flow ratio of $CH_3F$ to $N_2$ is from about 1 to about 4, and more preferably from about 1.2 to about 2.

After removal of the etchant residue from the substrate 5, optionally, a further process step can be performed in the cleaning chamber 35. In this process step, the remnant resist 15 is stripped from the substrate 5. The remnant resist 15 is the portions of the resist layer that remain after the etching process is completed, and typically comprise a substantially reduced thickness of resist layer. In the stripping step, the substrate 5 in the process zone 135 is exposed to an activated stripping gas comprising oxygen gas, and fluorocarbon gas such as $CF_4$, $C_2F_6$, $CHF_3$, $C_3H_2F_6$, or $C_2H_4F_2$. Alternative stripping gas compositions are described in U.S. Pat. No. 5,221,424, issued on Jun. 22, 1993, to Charles Steven Rhoades, which is incorporated herein by this reference. The stripping gas is activated by microwave or RF energy, and reacts with the remnant resist 15 to form volatile gaseous species that are exhausted from the process zone. In this manner, the etchant residue 10 and the remnant resist 15 on the substrate 5 is removed substantially without using a wet cleaning process.

In a preferred embodiment, the stripping gas comprises $O_2$, $CF_4$, and $N_2$, in a volumetric flow ratio of from about 40:1:10 to about 10:1:10, and more preferably of about 30:1:10. The substrate 5 exposed to the activated gas for a time of from about 30 to about 60 seconds, to substantially strip all of the remnant resist 15. During the stripping step, the cleaning chamber 35 is preferably maintained at a pressure of from about 0.01 to about 100 Torr, more preferably from about 0.5 to about 10 Torr, and most preferably at about 0.7 Torr.

Optionally, after removal of the remnant resist 15, the substrate 5 is rinsed in de-ionized water to remove any remnant resist 15 or etchant residue that sticks to the substrate surface. This is especially useful to remove soluble compounds formed by the reaction of the $CH_3$ radicals in the cleaning gas and the nonvolatile metal contaminants in the etchant residue. The rinsing step includes direct immersion in a static water bath, repeated immersion in a quick-dumprinser, and water spraying in spin rinse/dryers. In addition, methods which employ additional energy imparted to the water, such as ultrasonic baths or elevated temperatures, and methods that employ a surfactant can be used.

In contrast to a conventional methods for removing etchant residue 10 and remnant resist 15, the present process is highly selective to the dielectric layer 18 and reduces etching loss of the dielectric layer. By highly selective it is meant that the ratio of the rate at which etchant residue 10 and remnant resist 15 is removed to the rate at which dielectric material is removed from adjacent or underlying layers is a high ratio. For example, when the process of the present invention is used to remove etchant residue 10 after via etching, a high etching selectivity ratio with a low loss of adjacent or underlying layers of titanium nitride and TEOS deposited dielectric layer, of less than 150 Å is obtained. Preferably, the etchant removal process provides an etchant residue removal rate of at least about 35 nm/min together with an etching selectivity ratio of at least about 5:1, and more preferably a residue removal rate of 80 nm/min and an etching selectivity ratio of 10:1.

EXAMPLES

Examples 1–5 demonstrate the ability of the process of the present invention to remove etchant residue 10 and remnant resist 15 from a semiconductor substrate 5, without damaging the substrate, and while minimizing exposure of the substrate to oxidizing environments. These examples were undertaken using a MxP dielectric etching chamber 30 and a RPS cleaning chamber on a Precision 5000® multi chamber processing platforms 25, commercially available from Applied Materials, Santa Clara, Calif. The experiments were performed on silicon substrates having a diameter of about 200 mm (8 inches). Micrographs of cross-sectional views of the substrates were made using a scanning electron microscope after processes to remove etchant residue and remnant resist 15.

Example 1

Example 1 illustrates a preferred embodiment of the present process, in which etchant residue and remnant resist 15 were removed in multiple process steps. In this example, a substrate 5 comprising a silicon wafer having an aluminum alloy layer thereon, with an overlying layer of silicon dioxide, and a superimposed patterned resist layer, was etched in the dielectric etching chamber 30. The substrate 5 was exposed to a RF energy activated etchant gas comprising $CF_4$, $CHF_3$, and Ar, in a volumetric ratio of 1:3:10. The activated etchant gas was energized by maintaining the process electrodes 60, 65 at a RF bias voltage of about 400 volts, and the pressure in the etching chamber 30 was about 200 mTorr. A magnetic field of 30 Gauss was used to confine and stir the etchant plasma above the substrate 5.

Thereafter, the substrate was transported by the robotic arm 50 to the RPS chamber. In a cleaning step, the etchant residue was removed by exposing the substrate 5 for 60 seconds to an activated cleaning gas comprising 200 sccm $CH_3F$, 200 sccm $O_2$, and 150 sccm $N_2$. The microwave generator was maintained at a power level of 1000 Watts and the chamber at a pressure of 1500 mTorr. In a second step, the remnant resist 15 on the substrate 5 was stripped by a 30 second exposure to an activated stripping gas comprising 30 sccm $CF_4$, 970 sccm $O_2$, and 100 sccm $N_2$, maintained at a pressure of 700 mTorr and powered by a microwave generator operated at a power level of 1400 Watts. In both steps, the substrate 5 was maintained at a temperature of 100° C. by flowing helium at a pressure of about 8 Torr behind the substrate 5. Thereafter, the substrate 5 was rinsed by immersing the substrate in deionized water for 5 minutes.

SEM micrographs of the substrate 5 revealed complete removal of etchant residue 10 and remnant resist 15 with substantially no etchant residue remaining at the bottom of the via 24. Further, the critical dimension loss of the vias etched in the oxide layer is less than that provided by the standard post-via process treatments. Moreover, removal of the etchant residue 10 from the sidewalls 24 of the vias 22 left relatively smooth and undamaged sidewall surfaces having profile angles that were vertical and substantially uniform across the entire substrate surface.

Example 2

Example 2 demonstrates that the order of performing the etchant residue cleaning step and remnant resist stripping step is important. In this example, the same process parameters as in Example 1 were used, only the order of the etchant cleaning step and remnant resist stripping steps were reversed. Thus the stripping step was performed before the cleaning step, and immediately after the etching step. SEM micrographs taken of this substrate 5 revealed that etchant residue and remnant resist 15 were not completely removed. In particular significant amounts of etchant residue remained on the sidewalls near the top of the vias. Therefore, it is preferred to first perform the etchant residue cleaning step and then perform the remnant resist stripping step.

Example 3

Example 3 demonstrates that increasing the flow rate of $CH_3F$ in the etchant residue cleaning step adversely affects the cleaning process by failing to remove the etchant residue on the substrate 5. In this example, the volumetric flow rate of $CH_3F$ in the cleaning step was doubled from 200 sccm, as in Example 1, to 400 sccm. The remainder of the process parameters were the same as that of Example 1. SEM micrographs taken of the substrate 5 processed in this example reveal etchant deposits remaining at the bottom of the via hole and incomplete removal of the remnant resist 15. This demonstrates the importance of the volumetric flow ratio of $CH_3F$, $O_2$, and $N_2$ in the cleaning process step.

Example 4

In Example 4, the volumetric flow rate of all cleaning gases in the cleaning step were doubled (as compared to example 1) to the following flow rates 400 sccm $CH_3F$, 400 sccm $O_2$, and 300 sccm $N_2$. The remainder of the process parameters, including the pressure of the cleaning gas in the cleaning chamber, remained the same as that of Example 1. SEM micrographs taken of a substrate 5 processed according to this example, revealed etchant deposits at the bottom of the via holes and incomplete removal of the remnant resist 15. This experiment indicates that the volumetric flow rates, and not just the volumetric flow ratios, are important to the process.

Example 5

The results of Example 5, summarized in Table 1, show the advantages of the process of the present invention as compared to a conventional post-via etch wet treatment process for removing etchant residue 10 and remnant resist 15 from the substrate 5. In this example, one substrate was cleaned according to the process parameters of example 1, and another substrate was cleaned using EKC 265.

Thereafter, the electrical contact resistance of the exposed portions of the aluminum layers 16 was measured using a conventional resistance probe. These results demonstrate that the dry cleaning process gives higher yields with lower contact resistance; thus showing the superiority of the present process over conventional wet cleaning processes.

| TEST | TREATMENT BY CONVENTIONAL WET CLEANING PROCESS | TREATMENT BY PRESENT CLEANING PROCESS |
|---|---|---|
| CAPACITOR OXIDE THICKNESS | | |
| MEAN (Å) | 469 | 474 |
| MEDIAN (Å) | 528 | 534 |
| STANDARD DEVIATION (Å) | 125 | 129 |
| YIELD (%) | 97 | 99 |
| 0.5 μm M1-POLY CONTACT RESISTANCE | | |
| MEAN (Ohms) | 9.92 | 9.57 |
| MEDIAN (Ohms) | 9.81 | 9.51 |
| STANDARD DEVIATION (Ohms) | 1.11 | 1.32 |
| YIELD (%) | 100 | 100 |
| 0.56 μm M1-POLY CONTACT RESISTANCE | | |
| MEAN (Ohms) | 7.18 | 7.09 |
| MEDIAN (Ohms) | 7.15 | 6.91 |
| STANDARD DEVIATION (Ohms) | 7.67 | 0.97 |
| YIELD (%) | 100 | 100 |
| CAPACITOR LEAKAGE @ 0.5 V | | |
| MEAN (-log(A)) | 11.4 | 11.4 |
| MEDIAN (-log(A)) | 11.4 | 11.4 |
| STANDARD DEVIATION (-log(A)) | 0.36 | 0.25 |
| YIELD (%) | 95.7 | 96.3 |

Although the present invention has been described in considerable detail with regard to the preferred versions thereof, other versions are possible. For example, the cleaning process can be used for cleaning etchant residue from other etching processes, such as copper etching processes, and to clean the substrate 5 after etching features other than vias. Also, other sources of $CH_3$ radicals and other gases equivalent in function to the oxygen-containing or inert gas can also be used. Therefore, the appended claims should not be limited to the description of the preferred versions contained herein.

What is claimed is:

1. A method of cleaning a substrate, the method comprising exposing the substrate to an activated cleaning gas comprising halogen-substituted saturated hydrocarbon gas, oxygen gas, and nitrogen gas, wherein the halogen-substituted saturated hydrocarbon gas consists essentially of one or more of $CH_3F$, $CH_3Br$, or $CH_3Cl$, and wherein the volumetric flow ratio of the halogen-substituted saturated hydrocarbon gas to oxygen gas is from about 1:5 to about 2:1.

2. A method according to claim 1 further comprising the step of stripping residual resist on the substrate by exposing the substrate to an activated stripping gas comprising oxygen and carbon tetrafluoride.

3. A method according to claim 1 comprising exposing the substrate to activated cleaning gas introduced at a volumetric flow rate sufficient to remove etchant residue on the substrate.

4. A method according to claim 1 wherein the halogen-substituted saturated hydrocarbon gas consists essentially of $CH_3F$.

5. A method of cleaning a substrate, the method comprising exposing the substrate to an activated cleaning gas comprising halogen-substituted saturated hydrocarbon gas and oxygen gas, wherein the halogen-substituted saturated hydrocarbon gas consists essentially of $CH_3F$, and wherein the volumetric flow ratio of the halogen-substituted saturated hydrocarbon gas to oxygen gas is from about 1:5 to about 2:1.

6. A method according to claim 5 further comprising the step of stripping residual resist on the substrate by exposing the substrate to an activated stripping gas comprising oxygen and carbon tetrafluoride.

7. A method according to claim 5 wherein the activated cleaning gas further comprises one or more of $N_2$ or Ar.

8. A method according to claim 5 comprising exposing the substrate to activated cleaning gas introduced at a volumetric flow rate sufficient to remove etchant residue on the substrate.

9. A method of cleaning a substrate to remove etchant residue and stripping residual resist, the method consisting essentially of:
   a first step of exposing the substrate to an activated cleaning gas comprising halogen-substituted saturated hydrocarbon gas consisting essentially of one or more of $CH_3F$, $CH_3Br$ or $CH_3Cl$ and oxygen gas, and wherein the volumetric flow ratio of the halogen-substituted saturated hydrocarbon gas to oxygen gas is from about 1:5 to about 2:1; and
   a second step of stripping residual resist on the substrate by an activated stripping gas comprising oxygen and carbon tetrafluoride.

10. A method according to claim 9 wherein the activated cleaning gas further comprises one or more of $N_2$ or Ar.

11. A method according to claim 9 comprising exposing the substrate to activated cleaning gas introduced at a volumetric flow rate sufficient to remove etchant residue on the substrate.

12. A method according to claim 9 wherein the halogen-substituted saturated hydrocarbon gas consists essentially of one or more of $CH_3F$, $CH_3Br$, or $CH_3Cl$.

13. A method according to claim 12 wherein the halogen-substituted saturated hydrocarbon gas consists essentially of $CH_3F$.

14. A method according to claim 9 wherein the first step is before the second step.

15. A method according to claim 9 wherein the second step is after the first step.

16. A method of cleaning a substrate, the method comprising exposing the substrate to an activated cleaning gas comprising halogen-substituted saturated hydrocarbon gas and oxygen gas, whereby the activated cleaning gas removes etchant residue on the substrate, wherein the etchant residue comprises a metal species, and wherein the halogen-substituted saturated hydrocarbon gas consists essentially of one or more of $CH_3F$, $CH_3Br$, or $CH_3Cl$, and wherein the volumetric flow ratio of the halogen-substituted saturated hydrocarbon gas to oxygen gas is from about 1:5 to about 2:1.

17. A method according to claim 16 wherein the activated cleaning gas further comprises one or more of $N_2$ or Ar.

18. A method according to claim 16 wherein the halogen-substituted saturated hydrocarbon gas consists essentially of $CH_3F$.

19. A method of etching and cleaning a substrate, the method comprising the steps of:

(a) providing a substrate having a plurality of layers and an etch resistant layer;

(b) exposing the substrate to an activated etchant gas to etch a layer thereby forming etchant residue;

(c) exposing the substrate to an activated cleaning gas comprising halogen-substituted saturated hydrocarbon gas and oxygen gas, the halogen-substituted saturated hydrocarbon gas consisting essentially of one or more of $CH_3F$, $CH_3Br$, or $CH_3Cl$, and wherein the volumetric flow ratio of the halogen-substituted saturated hydrocarbon gas to oxygen gas is from about 1:5 to about 2:1; and (d) exposing the substrate to an activated stripping gas to remove the remnant resist.

20. The method of claim 19 wherein the volumetric flow ratio of halogen-substituted saturated hydrocarbon gas to oxygen gas in the activated cleaning gas is selected to remove the etchant residue on the substrate without requiring a post etch wet solvent cleaning step.

21. A method according to claim 19 wherein the activated cleaning gas further comprises one or more of $N_2$ or Ar.

22. A method according to claim 19 comprising exposing the substrate to activated cleaning gas introduced at a volumetric flow rate sufficient to remove etchant residue on the substrate.

23. A method according to claim 19 wherein the halogen-substituted saturated hydrocarbon gas consists essentially of $CH_3F$.

24. A method according to claim 19 wherein the plurality of layers comprises a metal layer covered by a dielectric layer.

25. A method according to claim 19 wherein the activated etchant gas comprises a halogen-containing gas.

26. A method according to claim 19 wherein the activated stripping gas comprises oxygen and carbon tetrafluoride.

27. A method according to claim 19 wherein step (d) is after step (c).

28. A method of cleaning a substrate, the method comprising exposing the substrate to an activated cleaning gas comprising halogen-substituted saturated hydrocarbon gas and oxygen gas, wherein the halogen-substituted saturated hydrocarbon gas consists essentially of one or more of $CH_3F$, $CH_3Br$, or $CH_3Cl$, and wherein the volumetric flow ratio of the halogen-substituted saturated hydrocarbon gas to oxygen gas is from about 1:6 to about 2:1.

29. A method according to claim 28 further comprising the step of stripping residual resist on the substrate by exposing the substrate to an activated stripping gas comprising oxygen and carbon tetrafluoride.

30. A method according to claim 28 wherein the activated cleaning gas further comprises one or more of $N_2$ or Ar.

31. A method according to claim 28 comprising exposing the substrate to activated cleaning gas introduced at a volumetric flow rate sufficient to remove etchant residue on the substrate.

32. A method of cleaning a substrate, the method comprising exposing the substrate to an activated cleaning gas comprising halogen-substituted saturated hydrocarbon gas and oxygen gas, wherein the halogen-substituted saturated hydrocarbon gas comprises one or more of $CH_3F$, $CH_3Br$ or $CH_3Cl$, and wherein the halogen-substituted saturated hydrocarbon gas consists essentially of one or more halogen-substituted saturated hydrocarbon compounds comprising a ratio of saturated hydrocarbon groups to substituted halogen species of at least 1:2, the volumetric flow ratio of the halogen-substituted saturated hydrocarbon compounds to oxygen gas being from about 1:5 to about 2:1.

33. A method according to claim 32 further comprising the step of stripping residual resist on the substrate by exposing the substrate to an activated stripping gas comprising oxygen and carbon tetrafluoride.

34. A method according to claim 32 wherein the activated cleaning gas further comprises one or more of $N_2$ or Ar.

35. A method according to claim 32 comprising exposing the substrate to activated cleaning gas introduced at a volumetric flow rate sufficient to remove etchant residue on the substrate.

36. A method according to claim 32 wherein the halogen-substituted saturated hydrocarbon gas consists essentially of one or more of $CH_3F$, $CH_3Br$, or $CH_3Cl$.

37. A method according to claim 36 wherein the halogen-substituted saturated hydrocarbon gas consists essentially of $CH_3F$.

38. A method of cleaning a substrate, the method comprising exposing the substrate to an activated cleaning gas comprising (i) one or more halogen-substituted saturated hydrocarbon compounds having a ratio of saturated hydrocarbon groups to substituted halogen species of at least 1:2 and (ii) oxygen gas, wherein the one or more halogen-substituted saturated hydrocarbon compounds having a ratio of saturated hydrocarbon groups to substituted halogen species of at least 1:2 consists essentially of one or more of $CH_3F$, $CH_3Br$, or $CH_3Cl$, and wherein the volumetric flow ratio of the halogen-substituted saturated hydrocarbon compounds to the oxygen gas is from about 1:5 to about 2:1.

39. A method according to claim 38 further comprising the step of stripping residual resist on the substrate by exposing the substrate to an activated stripping gas comprising oxygen and carbon tetrafluoride.

40. A method according to daim 38 wherein the activated cleaning gas further comprises one or more of $N_2$ or Ar.

41. A method according to claim 38 comprising exposing the substrate to activated cleaning gas introduced at a volumetric flow rate sufficient to remove etchant residue on the substrate.

42. A method according to claim 38 wherein the halogen-substituted saturated hydrocarbon compounds consists essentially of one or more of $CH_3F$, $CH_3Br$, or $CH_3Cl$.

43. A method according to claim 42 wherein the halogen-substituted saturated hydrocarbon compounds consists essentially of $CH_3F$.

* * * * *